(12) United States Patent
Mikajiri

(10) Patent No.: US 12,546,651 B2
(45) Date of Patent: Feb. 10, 2026

(54) OUTPUT CIRCUIT THAT OUTPUTS AMPLITUDE MODULATED SIGNAL HAVING VOLTAGE VALUE SELECTED FROM THREE OR MORE VOLTAGE VALUES

(71) Applicant: CANON KABUSHIKI KAISHA, Tokyo (JP)

(72) Inventor: Satoru Mikajiri, Gunma (JP)

(73) Assignee: Canon Kabushiki Kaisha, Tokyo (JP)

( * ) Notice: Subject to any disclaimer, the term of this patent is extended or adjusted under 35 U.S.C. 154(b) by 200 days.

(21) Appl. No.: 18/425,067

(22) Filed: Jan. 29, 2024

(65) Prior Publication Data

US 2024/0263996 A1 Aug. 8, 2024

(30) Foreign Application Priority Data

Feb. 3, 2023 (JP) .................................. 2023-015634

(51) Int. Cl.
   *G01J 1/44* (2006.01)
   *H03K 5/02* (2006.01)
   *H03K 17/56* (2006.01)

(52) U.S. Cl.
   CPC .................. *G01J 1/44* (2013.01); *H03K 5/02* (2013.01); *H03K 17/56* (2013.01)

(58) Field of Classification Search
   CPC .............. G01J 1/44; H03K 5/02; H03K 17/56
   See application file for complete search history.

(56) References Cited

U.S. PATENT DOCUMENTS

| 10,426,431 B2 | 10/2019 | Mikajiri |
| 2011/0032022 A1* | 2/2011 | Flewelling .......... H03K 19/001 327/365 |
| 2016/0352315 A1 | 12/2016 | Blecher |

FOREIGN PATENT DOCUMENTS

| JP | 2002-196831 A | 7/2002 |
| JP | 2005-223872 A | 8/2005 |
| JP | 2010-157786 A | 7/2010 |

* cited by examiner

*Primary Examiner* — Georgia Y Epps
*Assistant Examiner* — Monica T Taba
(74) *Attorney, Agent, or Firm* — Venable LLP

(57) ABSTRACT

Output circuit includes differential circuit arranged between first and second power supply lines, and switch and resistor connected in series between the first and second power supply lines. The differential circuit includes first differential output circuit including first positive-side output terminal and first negative-side output terminal, second differential output circuit including second positive-side output terminal and second negative-side output terminal, first output line connecting the first positive-side output terminal and the second positive-side output terminal, and second output line connecting the first negative-side output terminal and the second negative-side output terminal, amplitude modulated signal is output by the first and second output lines. The switch and the resistor suppress change in current flowing between the first and second power supply lines. The output circuit further includes disconnector to disconnect the second differential output circuit from the first differential output circuit.

17 Claims, 13 Drawing Sheets

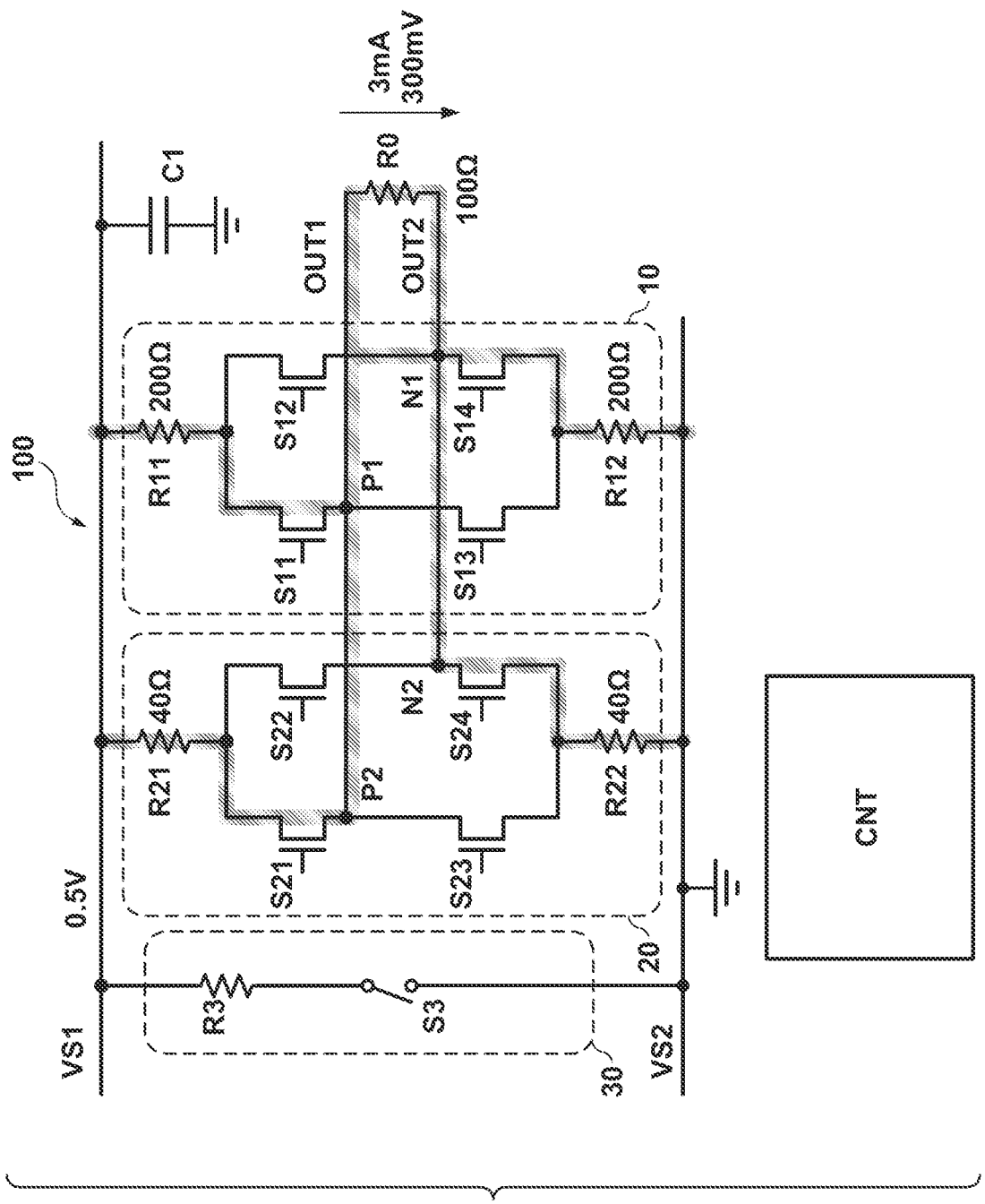
F I G. 2

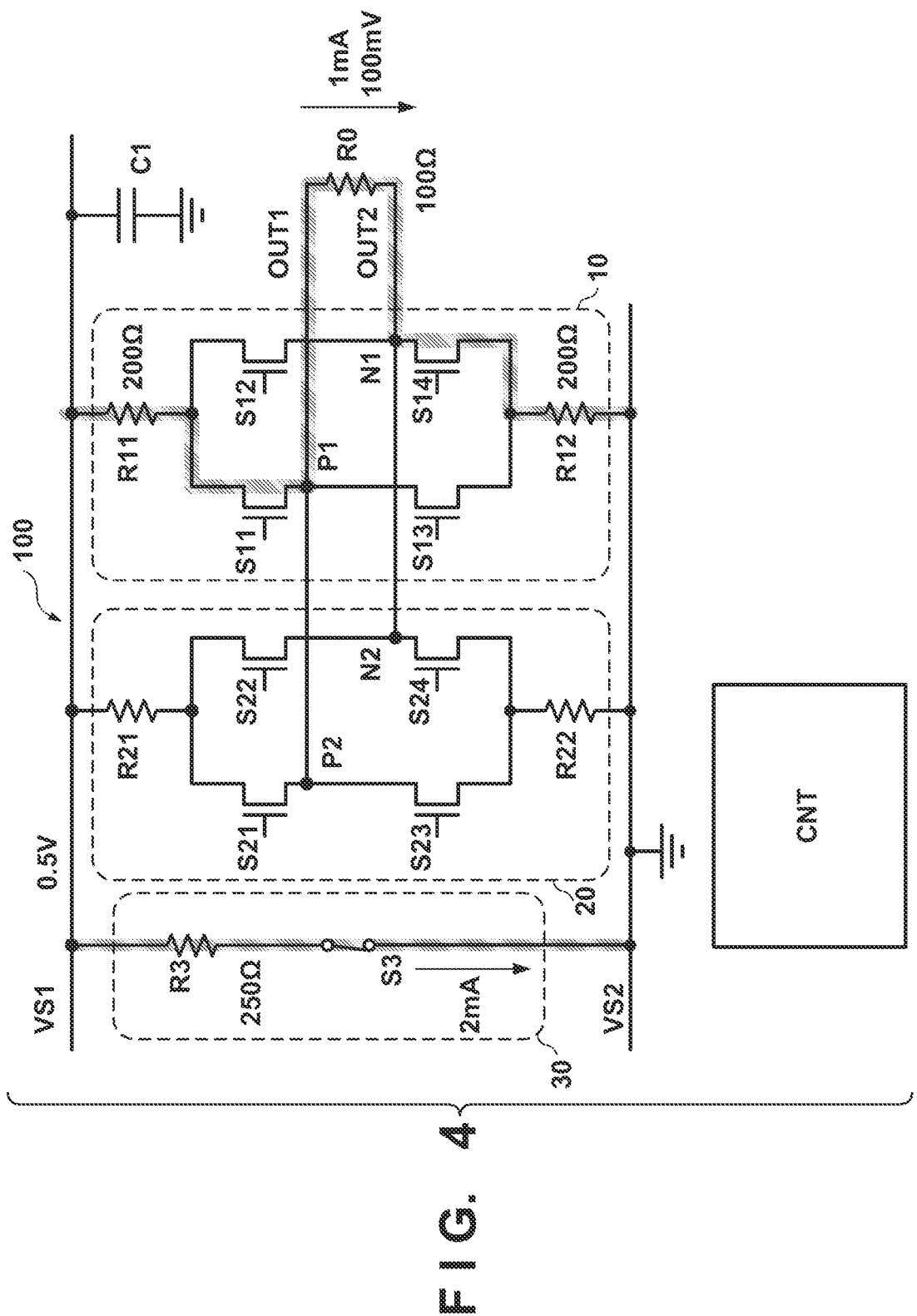
F I G. 4

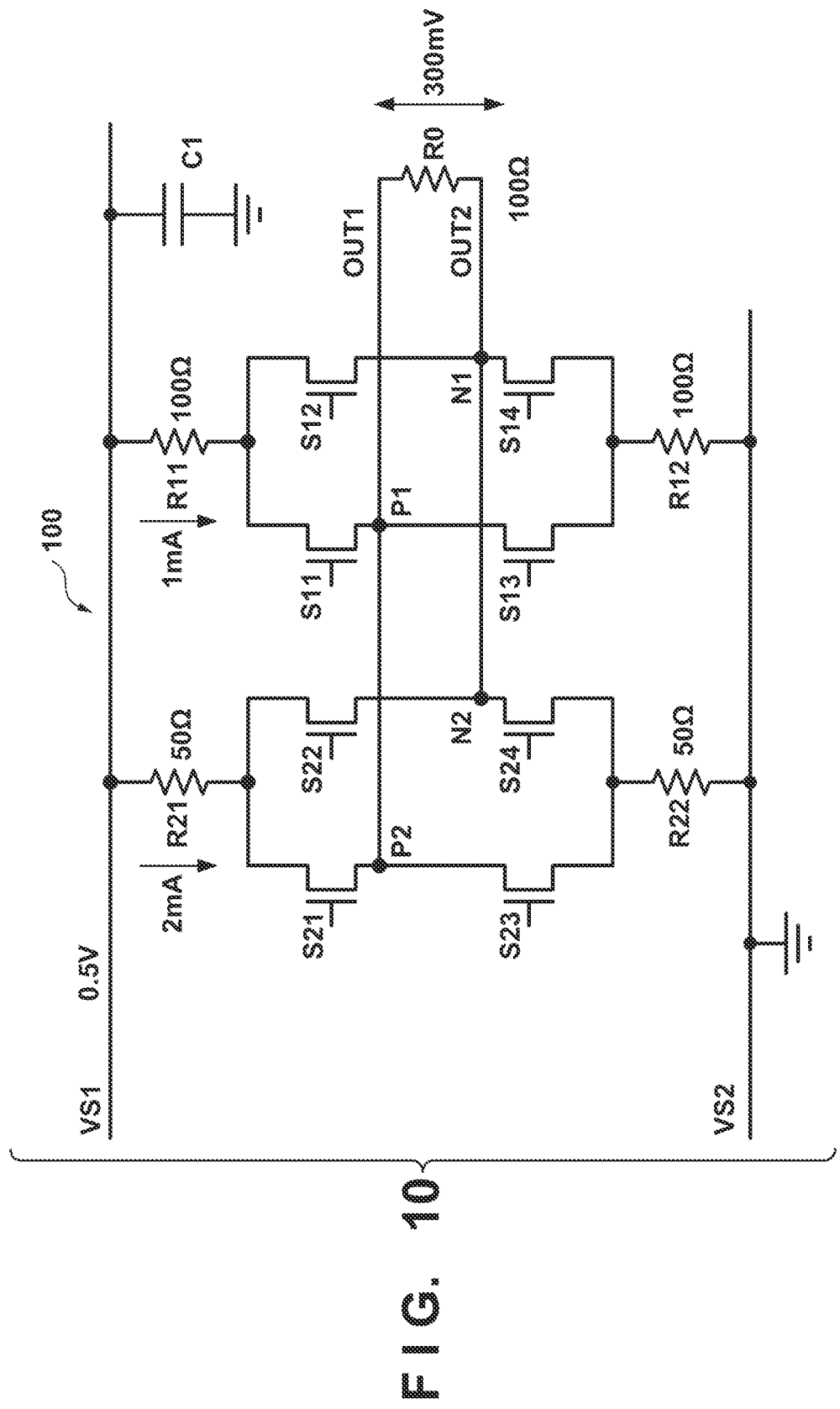
F I G. 10

OUTPUT CIRCUIT THAT OUTPUTS AMPLITUDE MODULATED SIGNAL HAVING VOLTAGE VALUE SELECTED FROM THREE OR MORE VOLTAGE VALUES

BACKGROUND OF THE INVENTION

Field of the Invention

The present invention relates to an output circuit that outputs an amplitude modulated signal having a voltage value selected from three or more voltage values.

Description of the Related Art

As one of transmission methods for transmitting a multi-valued voltage signal, there is a standard called PAM4. In PAM4, information is transmitted using four voltage values corresponding to 00, 01, 10, and 11. U.S. Patent Application Publication No. 2016-0352315 describes an output circuit (transmitter) applicable to PAM4.

However, with the arrangement of the transmitter described in U.S. Patent Application Publication No. 2016-0352315, the current supplied from a power supply line fluctuates in accordance with the voltage value output by the transmitter, and this causes fluctuation of the potential of the power supply line. This can lead to a deterioration of the eye pattern of the output signal of the transmitter. In order to suppress the deterioration, a large-capacitance bypass condenser (capacitor) can be connected to the power supply line, but this results in an increase in circuit area and a cost increase.

SUMMARY OF THE INVENTION

The present invention provides a technique advantageous in suppressing fluctuation of the potential of a power supply line.

One of aspects of the present invention provides an output circuit that outputs an amplitude modulated signal having a voltage value selected from three or more voltage values, the circuit comprising: a differential circuit arranged between a first power supply line and a second power supply line; and a switch and a resistor connected in series so as to form a path connecting the first power supply line and the second power supply line, wherein the differential circuit includes a first differential output circuit including a first positive-side output terminal and a first negative-side output terminal, a second differential output circuit including a second positive-side output terminal and a second negative-side output terminal, a first output line configured to connect the first positive-side output terminal and the second positive-side output terminal, and a second output line configured to connect the first negative-side output terminal and the second negative-side output terminal, the amplitude modulated signal is output by the first output line and the second output line, the switch and the resistor suppress a change of a value of a current flowing between the first power supply line and the second power supply line, which is caused by a change of an operation state of the differential circuit, and the circuit further comprises a disconnector configured to disconnect the second differential output circuit from the first differential output circuit.

Further features of the present invention will become apparent from the following description of exemplary embodiments with reference to the attached drawings.

BRIEF DESCRIPTION OF THE DRAWINGS

FIG. 2 is a view for explaining the operation of the output circuit according to the first embodiment;

FIG. 4 is a view for explaining the operation of the output circuit according to the first embodiment;

FIG. 10 is a view for explaining the operation of the output circuit according to the second embodiment;

DESCRIPTION OF THE EMBODIMENTS

Figure 1:
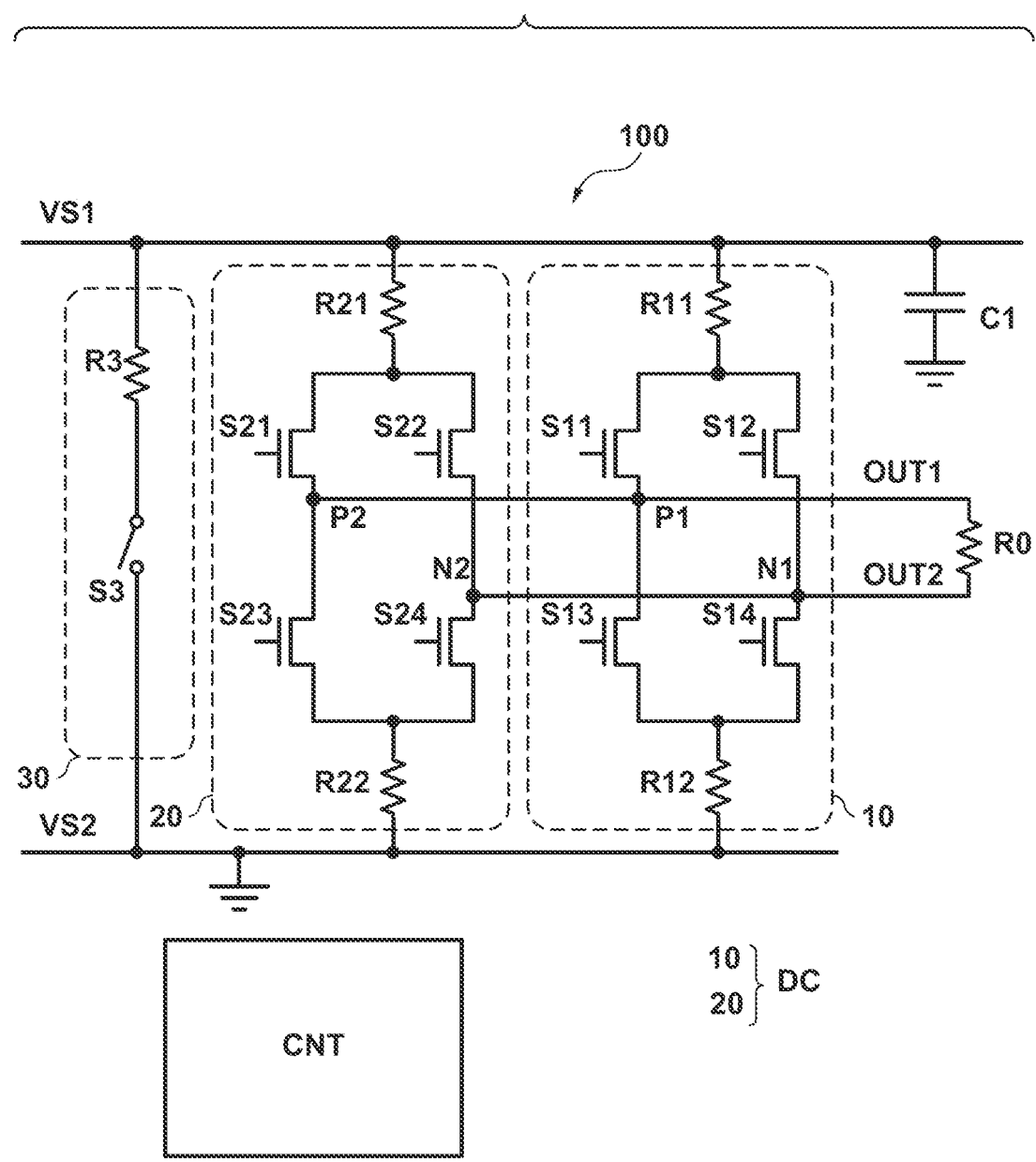
FIG. 1 is a view showing the arrangement of an output circuit according to the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 shows the arrangement of an output circuit 100 according to the first embodiment. The output circuit 100 can be understood as a transmitter or a differential signal output circuit. The output circuit 100 can be configured to output an amplitude modulated signal having a voltage value selected from an arbitrary number, which is three or more (for example, four, six, eight, or the like), of voltage values. In the example shown in FIG. 1, the output circuit 100 outputs an amplitude modulated signal having a voltage value selected from four voltage values. The amplitude modulated signal having a voltage value selected from four voltage values can transmit 2-bit information (that is, 00, 01, 10, or 11). The four voltage values can be assigned to, for example, a negative-side large amplitude value, a negative-side small amplitude value, a positive-side large amplitude value, and a positive-side small amplitude value. Here, the "large amplitude value" and the "small amplitude value" are relative expressions, and the absolute value of the large amplitude value is larger than the absolute value of the small amplitude value.

The output circuit 100 can include a differential circuit DC arranged between a first power supply line VS1 and a second power supply line VS2, and a switch S3 and a resistor R3 connected in series so as to form a path 30 (at least a part thereof) connecting the first power supply line VS1 and the second power supply line VS2. Here, the resistor R3 may be arranged between the switch S3 and the second power supply line VS2, or the resistor R3 may be arranged between the switch S3 and the first power supply line VS1. A predetermined voltage is supplied between the first power supply line VS1 and the second power supply line VS2. Here, it is assumed that the potential of the first power supply line VS1 is higher than the potential of the second power supply line VS2. The second power supply line VS2 may be grounded. In this case, the second power supply line VS2 is a ground line.

The differential circuit DC can include a first differential output circuit 10 including a first positive-side output terminal P1 and a first negative-side output terminal N1, and a second differential output circuit 20 including a second positive-side output terminal P2 and a second negative-side output terminal N2. The differential circuit DC can also include a first output line OUT1 connecting the first positive-side output terminal P1 and the second positive-side output terminal P2, and a second output line OUT2 connecting the first negative-side output terminal N1 and the second negative-side output terminal N2. The amplitude modulated signal as the output of the output circuit 100 is output by the first output line OUT1 and the second output line OUT2.

The switch S3 and the resistor R3 arranged in the path 30 suppresses a change of the value of the current flowing between the first power supply line VS1 and the second power supply line VS2, which is caused by a change of the operation state of the differential circuit DC (a change of the voltage value output from the differential circuit DC). The switch S3 and the resistor R3 preferably maintain the value of the current flowing between the first power supply line VS1 and the second power supply line VS2 at a constant value or within a predetermined allowable range, regardless of the change of the operation state of the differential circuit DC (the change of the output voltage value). The operation state of the differential circuit DC can include a first state in which the first differential output circuit 10 and the second differential output circuit 20 drive a load R0 connected between the first output line OUT1 and the second output line OUT2, and a second state in which the first differential output circuit 10 alone drives the load R0. The switch S3 can be controlled to be conductive in the second state. It is preferable that the value of the current flowing between the first power supply line VS1 and the second power supply line VS2 through the differential circuit DC in the first state is equal to the value of the current flowing between the first power supply line VS1 and the second power supply line VS2 through the differential circuit DC and the path 30 in the second state.

The first differential output circuit 10 can be operated when the output circuit 100 or the differential circuit DC outputs a voltage having a negative-side or positive-side large amplitude value between the first output line OUT1 and the second output line OUT2. The first differential output circuit 10 can also be operated when the output circuit 100 or the differential circuit DC outputs a voltage having a negative-side or positive-side small amplitude value between the first output line OUT1 and the second output line OUT2. When the first differential output circuit 10 is operated, this means that the first differential output circuit 10 supplies a current between the first output line OUT1 and the second output line OUT2. Alternatively, when the first differential output circuit 10 is operated, this means that a substantial current flows from the first power supply line VS1 to the second power supply line VS2 through the first differential output circuit 10. A substantial current is a current whose value is significantly different from the value of an unintended current such as a through current.

The second differential output circuit 20 can be operated when the output circuit 100 or the differential circuit DC outputs a voltage having a negative-side or positive-side large amplitude value between the first output line OUT1 and the second output line OUT2. However, the second differential output circuit 20 can stop the operation when the output circuit 100 or the differential circuit DC outputs a voltage having a negative-side or positive-side small amplitude value between the first output line OUT1 and the second output line OUT2. When the second differential output circuit 20 is operated, this means that the second differential output circuit 20 supplies a current between the first output line OUT1 and the second output line OUT2. Alternatively, when the second differential output circuit 20 is operated, this means that a substantial current flows from the first power supply line VS1 to the second power supply line VS2 through the second differential output circuit 20.

The first differential output circuit 10 can include an 11th resistive element R11 arranged between the first power supply line VS1 and the first positive-side output terminal P1. The first differential output circuit 10 can also include an 11th switch element S11 arranged between the 11th resistive element R11 and the first positive-side output terminal P1, and a 12th switch element S12 arranged between the 11th resistive element R11 and the first negative-side output terminal N1. The first differential output circuit 10 can also include a 12th resistive element R12 arranged between the second power supply line VS2 and the first negative-side output terminal N1. The first differential output circuit 10 can also include a 13th switch element S13 arranged between the 12th resistive element R12 and the first positive-side output terminal P1, and a 14th switch element S14 arranged between the 12th resistive element R12 and the first negative-side output terminal N1.

The second differential output circuit 20 can include a 21st resistive element R21 arranged between the first power supply line VS1 and the second positive-side output terminal P2. The second differential output circuit 20 can also include a 21st switch element S21 arranged between the 21st resistive element R21 and the second positive-side output terminal P2, and a 22nd switch element S22 arranged between the 21st resistive element R21 and the second negative-side output terminal N2. The second differential output circuit 20 can also include a 22nd resistive element R22 arranged between the second power supply line VS2 and the second positive-side output terminal P2. The second differential output circuit 20 can also include a 23rd switch element S23 arranged between the 22nd resistive element R22 and the second positive-side output terminal P2, and a 24th switch element S24 arranged between the 22nd resistive element R22 and the second negative-side output terminal N2.

Note that the numerical value "xx" in the xxth resistive element is used to distinguish a plurality of resistive elements from each other, and the numerical value itself has no other meaning. Similarly, the numerical value "xx" in the xxth switch element is used to distinguish a plurality of switch elements from each other, and the numerical value itself has no other meaning. The above-described switch elements can be formed by transistors such as MOS transistors. The transistors may be p-type transistors or n-type transistors. Both types may be mixed as long as there is no contradiction between operations.

The first output line OUT1 and the second output line OUT2 can be connected to the first input terminal and the second input terminal of a receiver (reception circuit), respectively. R0 in FIG. 1 is a load between the first input terminal and the second input terminal of the receiver (reception circuit).

The output circuit 100 can further include a capacitor C1 arranged between the first power supply line VS1 and the second power supply line VS2. The capacitor C1 can function so as to smooth the voltage between the first power supply line VS1 and the second power supply line VS2, that is, the power supply voltage. The capacitor C1 can be called a decoupling capacitor. Including the switch S3 and the resistor R3 connected in series in the path 30 is advantageous in decreasing the capacitance value required for the capacitor C1.

The output circuit 100 can further include a control circuit CNT that controls the differential circuit DC and the switch S3. The control circuit CNT controls the respective switch elements of the differential circuit DC and the switch S3 in the path 30 in accordance with the voltage value (in this example, the positive-side large amplitude value, the negative-side large amplitude value, the positive-side small amplitude value, or the negative-side small amplitude value) to be output by the output circuit 100.

Hereinafter, with reference to FIGS. 2 to 5, control of the respective switch elements of the differential circuit DC and the switch S3 in the path 30 by the control circuit CNT performed when the output circuit 100 outputs the positive-side large amplitude value, the negative-side large amplitude value, the positive-side small amplitude value, or the negative-side small amplitude value will be exemplarily described. Here, as an example, assume that the potential of the first power supply line VS1 (the potential difference between the first power supply line VS1 and the second power supply line VS2) is 0.5 V. In addition, assume that the resistance value of each of R11 and R12 is 200Ω, the resistance value of each of R21 and R22 is 40Ω, the resistance value of R3 is 250Ω, and the resistance value of R0 is 100Ω. In FIGS. 2 to 5, each thick gray line indicates a current path. Assume that the positive-side large amplitude value is +300 mV, the negative-side large amplitude value is −300 mV, the positive-side small amplitude value is +100 mV, and the negative-side small amplitude value is −100 mV.

FIG. 2 schematically shows the operation of the output circuit 100 outputting the positive-side large amplitude value (+300 mV). The control circuit CNT turns on (sets in a conductive state) the switch elements S11, S14, S21, and S24, and turns off (sets in a non-conductive state) the switch elements S12, S13, S22, and S23 and the switch S3. The combined resistance value between the first power supply line VS1 and the first output line OUT1 is 33Ω, and the combined resistance value between the second power supply line VS2 and the second output line OUT2 is 33Ω. Accordingly, the combined resistance value between the first power supply line VS1 and the second power supply line VS2 is 166Ω. A current of 3 mA flows through the load R0 from the first output line OUT1 toward the second output line OUT2, so that a voltage of +300 mV appears across the load R0. Since the switch S3 is in the OFF state, no current flows through the path 30. Thus, a current of 3 mA flows from the first power supply line VS1 toward the second power supply line VS2.

Figure 3:
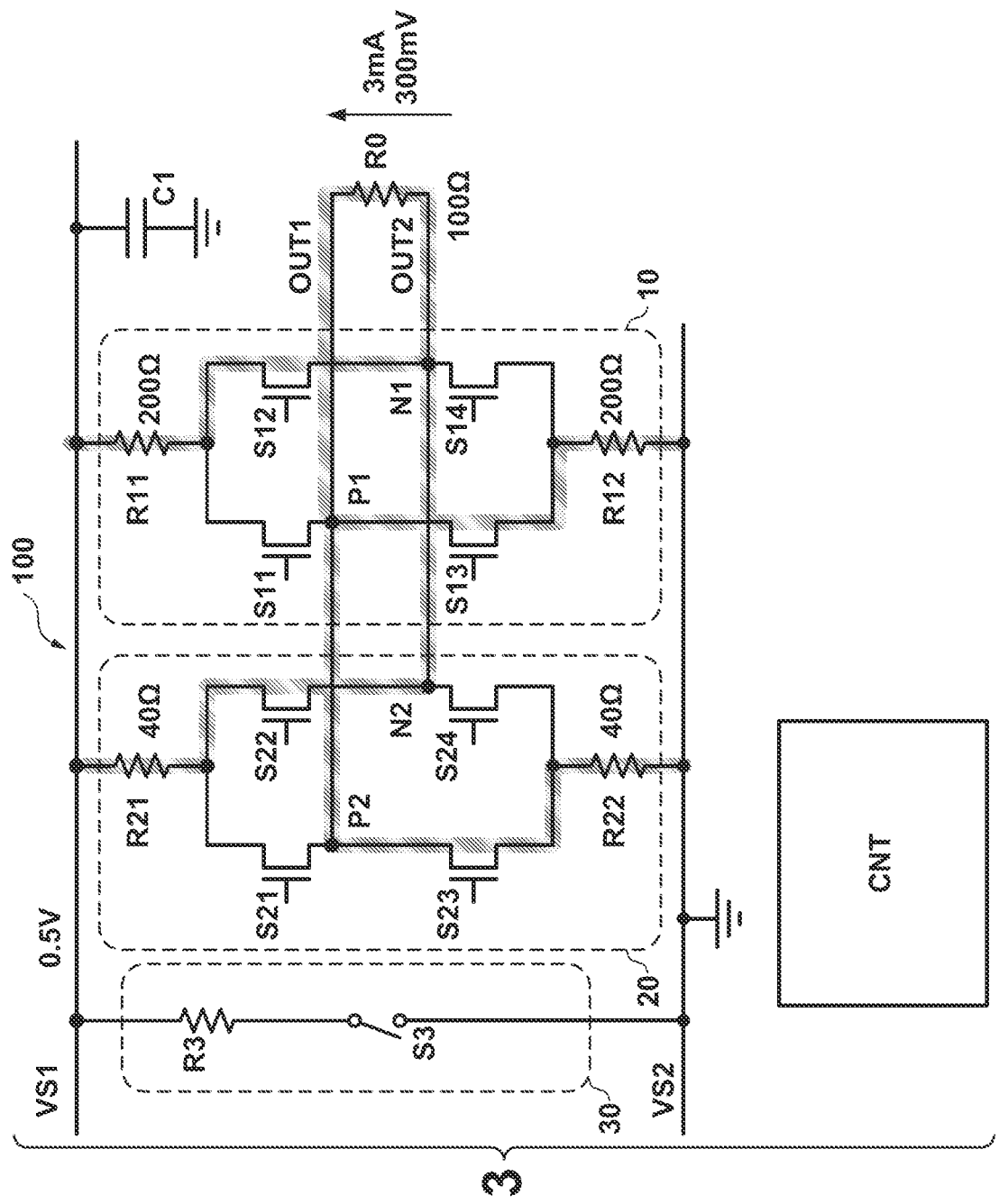
FIG. 3 is a view for explaining the operation of the output circuit according to the first embodiment.

FIG. 3 schematically shows the operation of the output circuit 100 outputting the negative-side large amplitude value (−300 mV). The control circuit CNT turns on (sets in a conductive state) the switch elements S12, S13, S22, and S23, and turns off (sets in a non-conductive state) the switch elements S11, S14, S21, and S24 and the switch S3. The combined resistance value between the first power supply line VS1 and the first output line OUT1 is 33Ω, and the combined resistance value between the second power supply line VS2 and the second output line OUT2 is 33Ω. Accordingly, the combined resistance value between the first power supply line VS1 and the second power supply line VS2 is 166Ω. A current of 3 mA flows through the load R0 from the second output line OUT2 toward the first output line OUT1, so that a voltage of −300 mV appears across the load R0. Since the switch S3 is in the OFF state, no current flows through the path 30. Thus, a current of 3 mA flows from the first power supply line VS1 toward the second power supply line VS2.

FIG. 4 schematically shows the operation of the output circuit 100 outputting the positive-side small amplitude value (+100 mV). The control circuit CNT turns on (sets in a conductive state) the switch elements S11 and S14 and the switch S3, and turns off (sets in a non-conductive state) the switch elements S12, S13, S21, S22, S23, and S24. The resistance value between the first power supply line VS1 and the first output line OUT1 is 200Ω, and the resistance value between the second power supply line VS2 and the second output line OUT2 is 200Ω. Accordingly, the combined resistance value between the first power supply line VS1 and the second power supply line VS2 is 500Ω. A current of 1 mA flows through the load R0 from the first output line OUT1 toward the second output line OUT2, so that a voltage of +100 mV appears across the load R0. In addition, in the path 30, a current of 2 mA flows from the first power supply line VS1 toward the second power supply line VS2 through the switch S3 and the resistor R3. Thus, a current of 3 mA in total flows from the first power supply line VS1 toward the second power supply line VS2.

Figure 5:
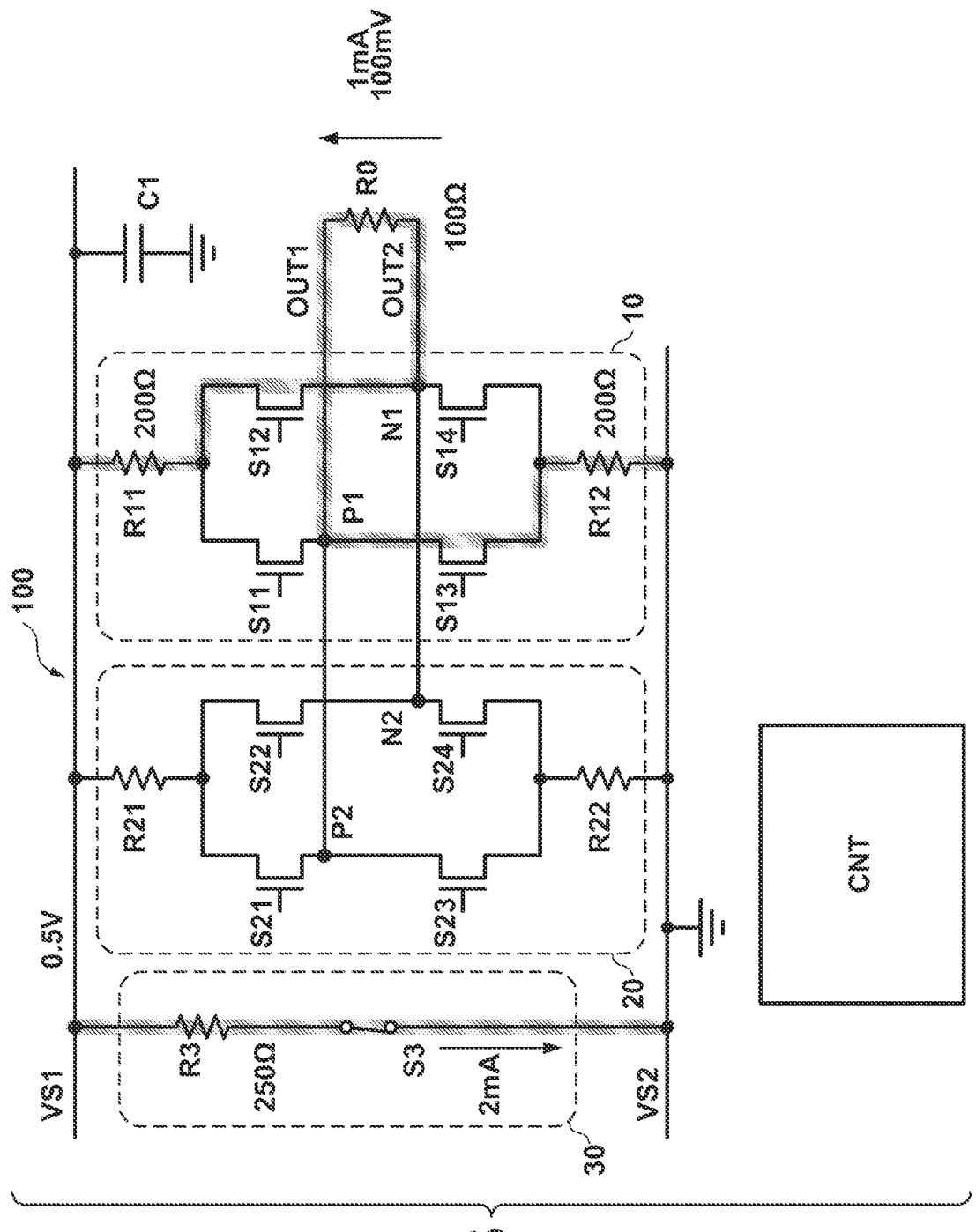
FIG. 5 is a view for explaining the operation of the output circuit according to the first embodiment.

FIG. 5 schematically shows the operation of the output circuit 100 outputting the negative-side small amplitude value (−100 mV). The control circuit CNT turns on (sets in a conductive state) the switch elements S12 and S13 and the switch S3, and turns off (sets in a non-conductive state) the switch elements S11, S14, S21, S22, S23, and S24. The resistance value between the first power supply line VS1 and the first output line OUT1 is 200Ω, and the resistance value between the second power supply line VS2 and the second output line OUT2 is 200Ω. Accordingly, the combined resistance value between the first power supply line VS1 and the second power supply line VS2 is 500Ω. A current of 1 mA flows through the load R0 from the second output line OUT2 toward the first output line OUT1, so that a voltage of −100 mV appears across the load R0. In addition, in the path 30, a current of 2 mA flows from the first power supply line VS1 toward the second power supply line VS2 through the switch S3 and the resistor R3. Thus, a current of 3 mA in total flows from the first power supply line VS1 toward the second power supply line VS2.

As has been described above, according to the first embodiment, regardless of the voltage value (in this example, the positive-side large amplitude value, the negative-side large amplitude value, the positive-side small amplitude value, or the negative-side small amplitude value) to be output by the output circuit 100, a current of 3 mA always flows from the first power supply line VS1 toward the second power supply line VS2. Thus, the potential of the first power supply line VS1 (the potential difference between the first power supply line VS1 and the second power supply line VS2) can be maintained constant. This is advantageous in decreasing the capacitance value required for the capacitor C1. Decreasing the capacitance value required for the capacitor C1 is advantageous in reducing the circuit area and cost reduction.

Figure 6:
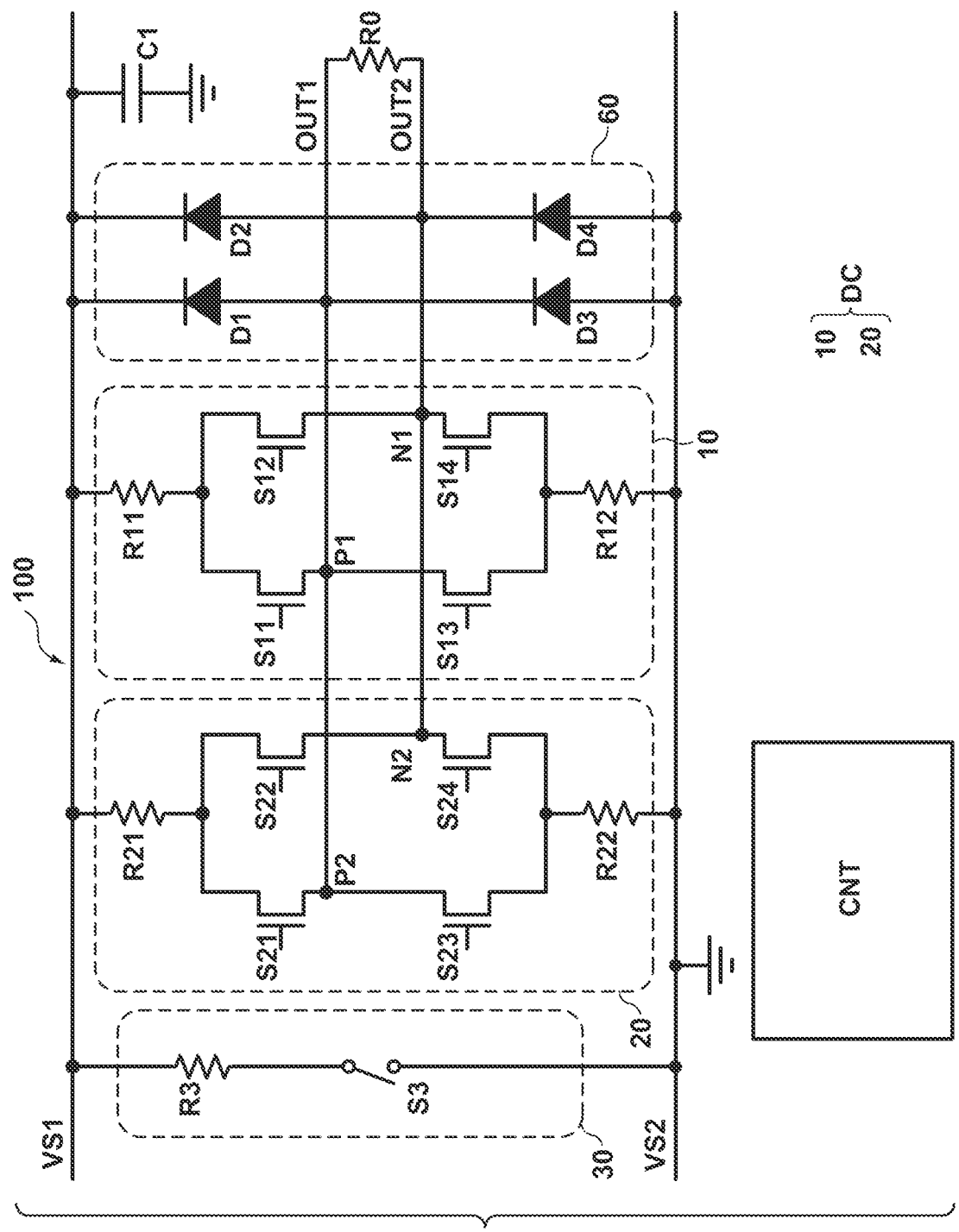
FIG. 6 is a view showing the arrangement of the output circuit according to the first embodiment.

As exemplarily shown in FIG. 6, the output circuit 100 may further include an ESD protection circuit 60 that protects the differential circuit DC. The ESD protection circuit 60 can include diodes D1, D2, D3, and D4. The anode of the diode D1 can be connected to the first output line OUT1, and the cathode of the diode D1 can be connected to the first power supply line VS1. The anode of the diode D2 can be connected to the second output line OUT2, and the cathode of the diode D2 can be connected to the first power supply line VS1. The anode of the diode D3 can be connected to the second power supply line VS2, and the cathode of the diode D3 can be connected to the first output line OUT1. The anode of the diode D4 can be connected to the second power supply line VS2, and the cathode of the diode D4 can be connected to the second output line OUT2. When the ESD protection circuit 60 is provided, the switch elements connected to the first output line OUT1 and the second output line OUT2 can be protected from ESD.

Figure 7:
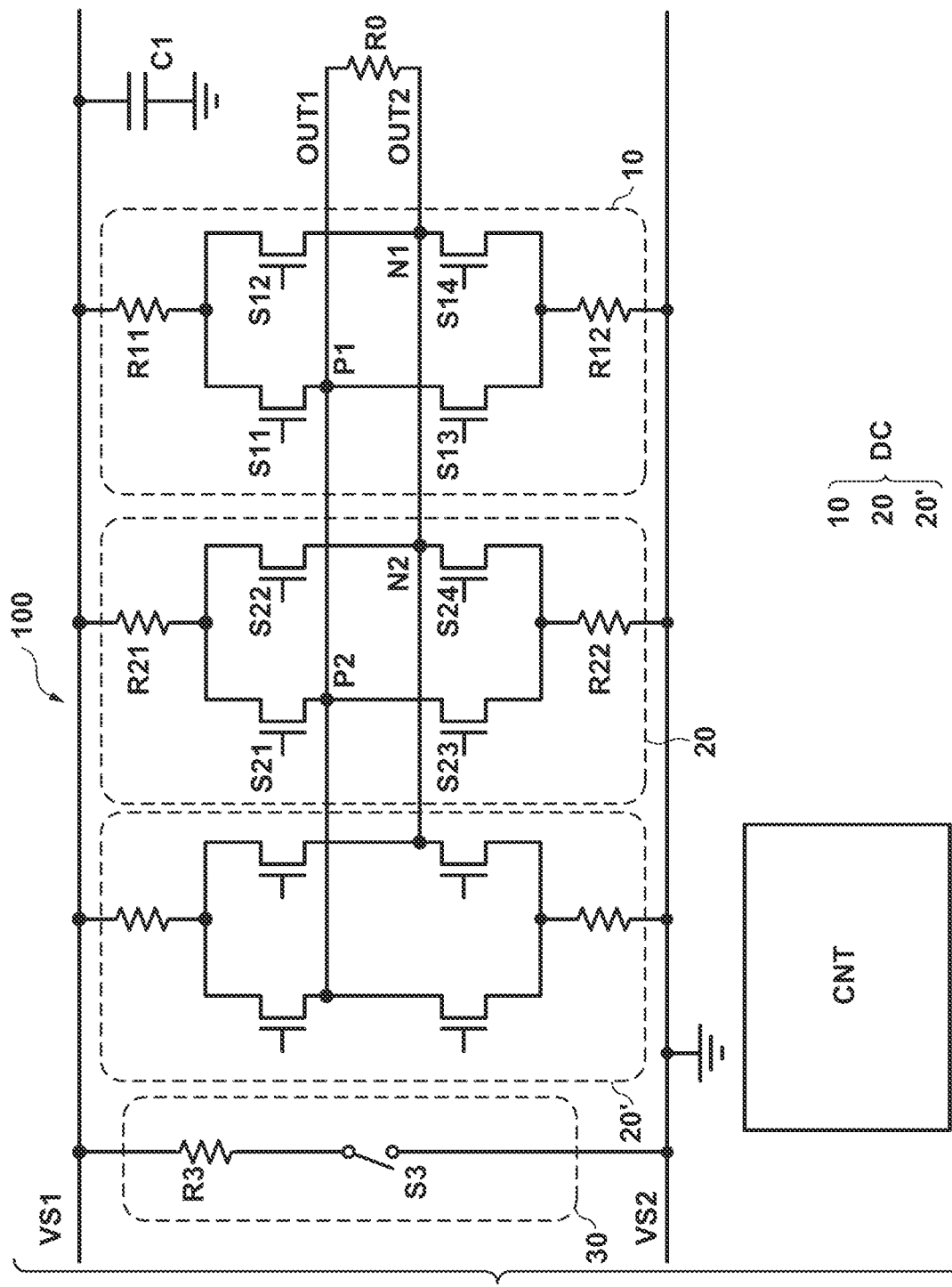
FIG. 7 is a view showing a modification of the output circuit according to the first embodiment.

FIG. 7 shows the output circuit 100 according to a modification of the first embodiment. The differential circuit DC of the output circuit 100 may include one or a plurality of differential output circuits 20' in addition to the first differential output circuit 10 and the second differential output circuit 20. The differential output circuit 20' can have an arrangement similar to that of the first differential output circuit 10 or the second differential output circuit 20. When the differential output circuit 20' is added, a multi-valued amplitude modulated signal containing more values can be generated.

Figure 8:
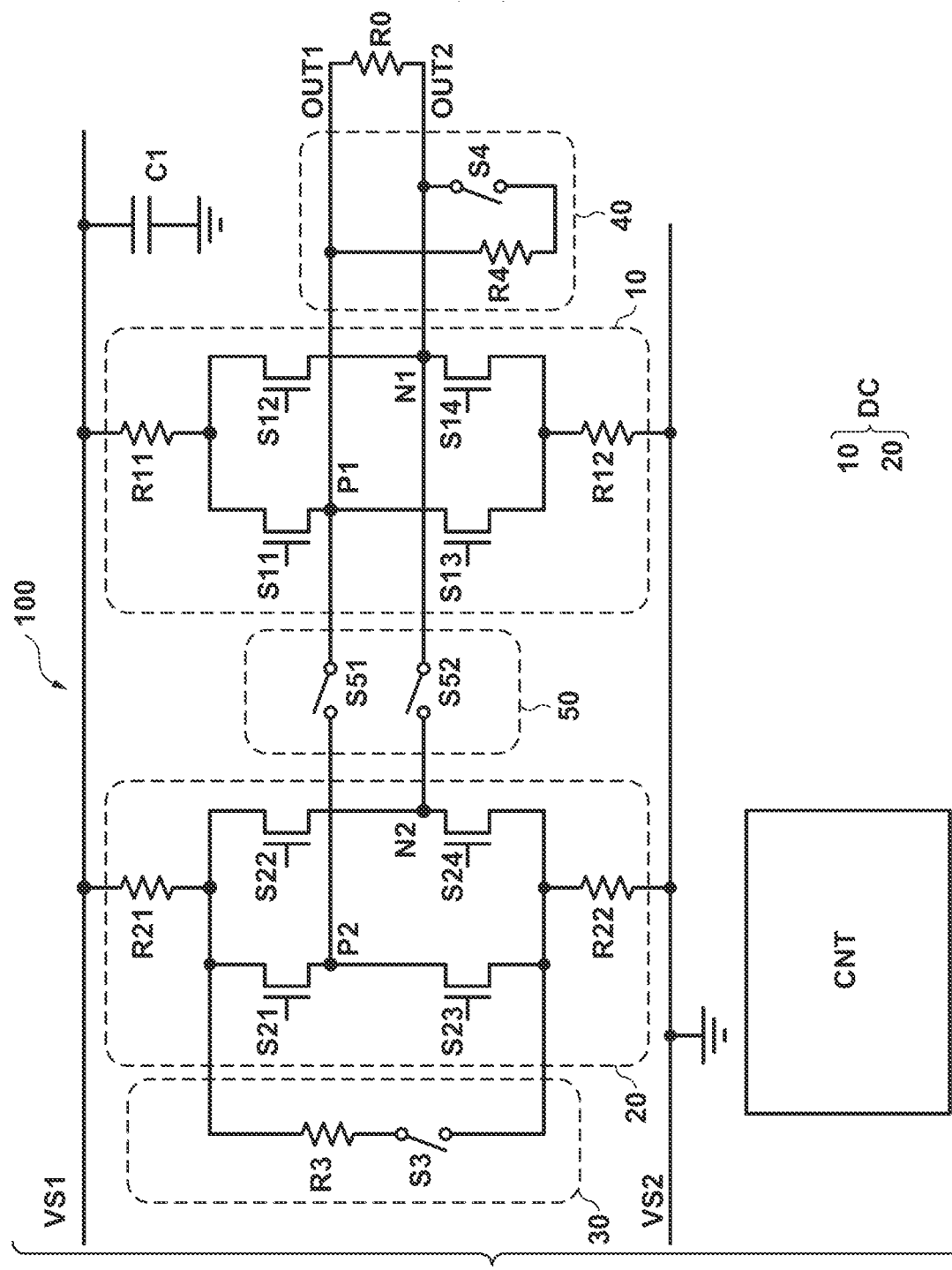
FIG. 8 is a view showing the arrangement of an output circuit according to the second embodiment.

FIG. 8 shows the arrangement of an output circuit 100 according to the second embodiment. Matters not mentioned concerning the arrangement and operation of the output circuit 100 according to the second embodiment can follow the first embodiment. As exemplarily shown in FIG. 8, a path 30 can be arranged so as to connect a 21st resistive element R21 and a 22nd resistive element R22. In other words, a switch S3 and a resistor R3 can be arranged so as to connect the 21st resistive element R21 and the 22nd resistive element R22. Here, the resistor R3 may be arranged between the switch S3 and the 21st resistive element R21, or the resistor R3 may be arranged between the switch S3 and the 22nd resistive element R22.

As exemplarily shown in FIG. 8, the output circuit 100 may further include a disconnector 50 that disconnects a second differential output circuit 20 from a first differential output circuit 10 (alternatively, a first output line OUT1 and a second output line OUT2). The disconnector 50 can be controlled by a control circuit CNT. The control circuit CNT can control the disconnector 50 so as to disconnect the second differential output circuit 20 from the first differential output circuit 10 (alternatively, the first output line OUT1 and the second output line OUT2) in a period in which the second differential output circuit 20 is not operated. The control circuit CNT can control the disconnector 50 so as to connect the second differential output circuit 20 to the first differential output circuit 10 (alternatively, the first output line OUT1 and the second output line OUT2) in a period in which the second differential output circuit 20 is operated. The disconnector 50 can include a first switch S51 arranged in the first output line OUT1 so as to be capable of disconnecting the second differential output circuit 20 from the first differential output circuit 10, and a second switch S52 arranged in the second output line OUT2 so as to be capable of disconnecting the second differential output circuit 20 from the first differential output circuit 10.

The output circuit 100 may further include a current path 40 provided in parallel with a load R0 connected between the first output line OUT1 and the second output line OUT2. A third switch S4 and a third resistor R4 can be arranged in series in the current path 40. The third switch S4 can be controlled by the control circuit CNT. For example, in a case of a small amplitude, the current path 40 can function so as to adjust the width of the small amplification by the ratio of the resistance value of the load R0 and the resistance value of the third resistor R4.

Figure 9:
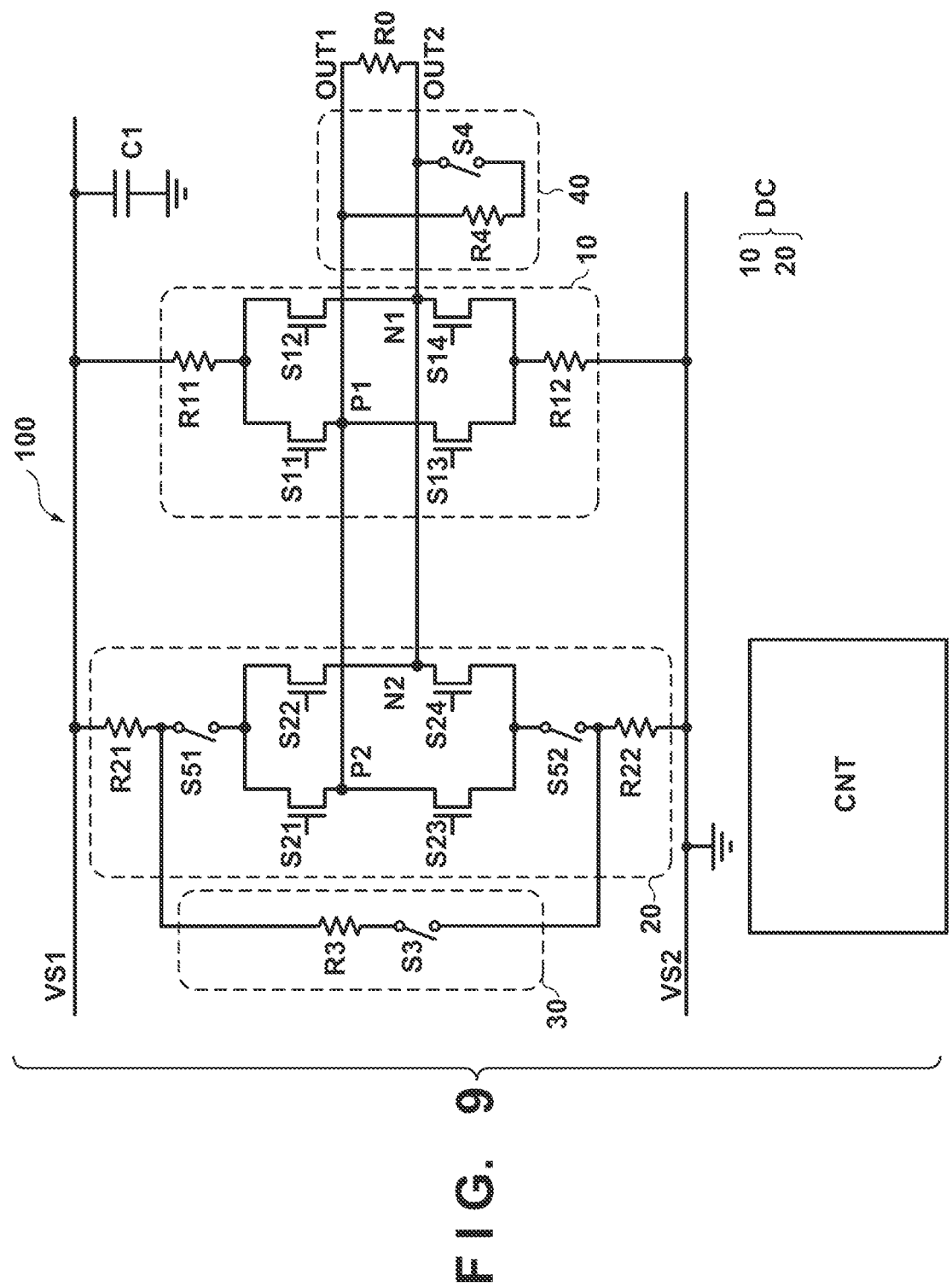
FIG. 9 is a view showing a modification of the output circuit according to the second embodiment.

FIG. 9 shows the arrangement of a modification of the output circuit 100 according to the second embodiment shown in FIG. 8. In the modification shown in FIG. 9, the first switch S51 is arranged between the 21st resistive element R21 and a node connecting a 21st switch element S21 and a 22nd switch element S22. Further, the second switch S52 is arranged between the 22nd resistive element R22 and a node connecting a 23rd switch element S23 and a 24th switch element S24. The first switch S51 and the second switch S52 disconnect the second differential output circuit 20 from the first differential output circuit 10 (alternatively, the first output line OUT1 and the second output line OUT2) by stopping the operation of the second differential output circuit 20. Alternatively, the first switch S51 and the second switch S52 may simply be understood as a circuit for stopping the operation of the second differential output circuit 20. The path 30 can be arranged so as to connect the 21st resistive element R21 and the 22nd resistive element R22.

Hereinafter, with reference to FIGS. 10 and 11, control of the respective switch elements of the differential circuit DC and the switch S3 in the path 30 by the control circuit CNT performed when the output circuit 100 outputs the positive-side large amplitude value, the negative-side large amplitude value, the positive-side small amplitude value, or the negative-side small amplitude value will be exemplarily described. Here, as an example, assume that the potential of a first power supply line VS1 (the potential difference between the first power supply line VS1 and a second power supply line VS2) is 0.5 V. Assume that the resistance value of each of R11 and R12 is 100Ω, the resistance value of each of R21 and R22 is 50Ω, the resistance value of R0 is 100Ω, the resistance value of R3 is 400Ω, and the resistance value of R4 is 100Ω. Assume that the positive-side large amplitude value is +300 mV, the negative-side large amplitude value is −300 mV, the positive-side small amplitude value is +100 mV, and the negative-side small amplitude value is −100 mV.

FIG. 10 schematically shows the operation of the output circuit 100 outputting the positive-side or negative-side large amplitude value (+300 mV or −300 mV). In the operation of the output circuit 100 outputting the positive-side large amplitude value (+300 mV), the control circuit CNT turns on the switch elements S11, S14, S21, and S24 and the switches S51 and S52, and turns off the switch elements S12, S13, S22, and S23 and the switches S3 and S4. This operation is similar to the operation shown in FIG. 2. In the operation of the output circuit 100 outputting the negative-side large amplitude value (−300 mV), the control circuit CNT turns on the switch elements S12, S13, S22, and S23 and the switches S51 and S52, and turns off the switch elements S11, S14, S21, and S24 and the switches S3 and S4. This operation is similar to the operation shown in FIG. 3.

Figure 11:
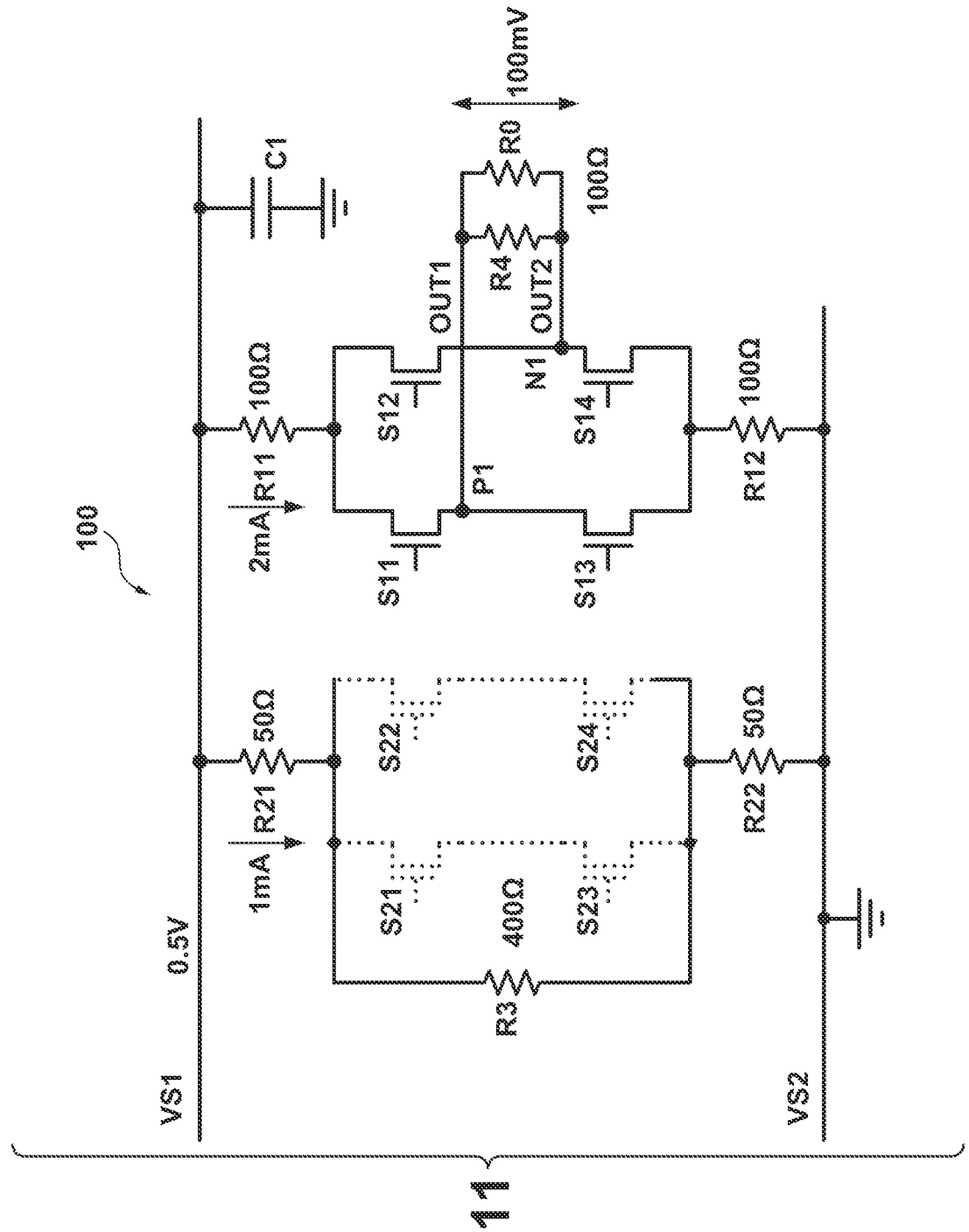
FIG. 11 is a view for explaining the operation of the output circuit according to the second embodiment.

FIG. 11 schematically shows the operation of the output circuit 100 outputting the positive-side or negative-side small amplitude value (+100 mV or −100 mV). In the operation of the output circuit 100 outputting the positive-side small amplitude value (+100 mV), the control circuit CNT turns on the switch elements S11, S14, S21, and S24 and the switches S3 and S4, and turns off the switch elements S12, S13, S22, and S23 and the switches S51 and S52. The voltage appearing across the load R0 and the current flowing from the first power supply line VS1 toward the second power supply line VS2 are similar to those in the operation shown in FIG. 4. On the other hand, in the operation of the output circuit 100 outputting the negative-side small amplitude value (−100 mV), the control circuit CNT turns on the switch elements S12, S13, S22, and S23 and the switches S3 and S4, and turns off the switch elements S11, S14, S21, and S24 and the switches S51 and S52. The voltage appearing across the load R0 and the current flowing from the first power supply line VS1 toward the second power supply line VS2 are similar to those in the operation shown in FIG. 5.

Figure 12:
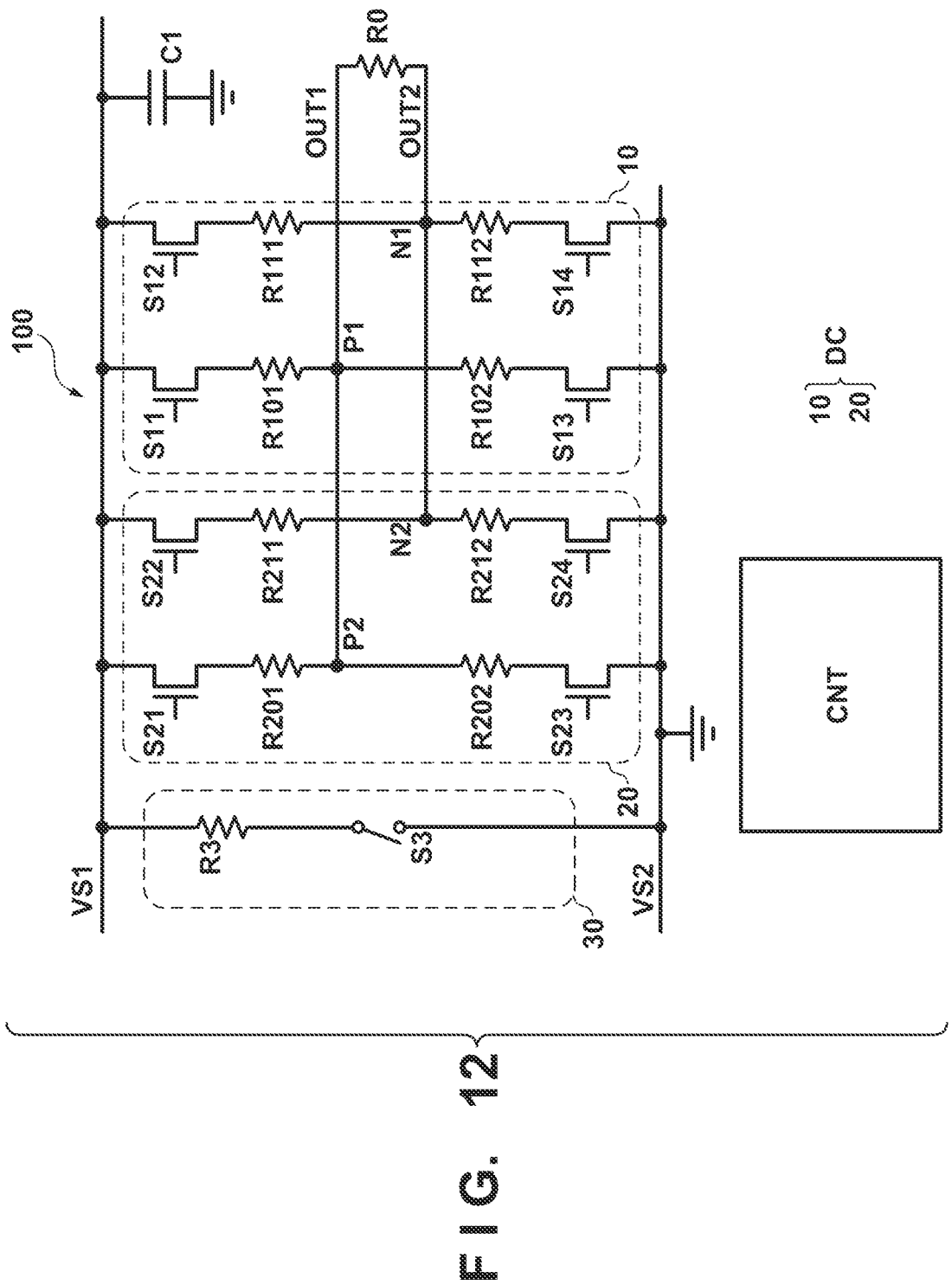
FIG. 12 is a view showing the arrangement of an output circuit according to the third embodiment.

FIG. 12 shows the arrangement of an output circuit 100 according to the third embodiment. Matters not mentioned concerning the arrangement and operation of the output circuit 100 according to the third embodiment can follow the first embodiment. As in the first embodiment, the output circuit 100 according to the third embodiment can include a differential circuit DC arranged between a first power supply line VS1 and a second power supply line VS2, and a switch S3 and a resistor R3 connected in series in a path connecting the first power supply line VS1 and the second power supply line VS2. Here, the resistor R3 may be arranged between the switch S3 and the second power supply line VS2, or the resistor R3 may be arranged between the switch S3 and the first power supply line VS1.

The differential circuit DC can include a first differential output circuit 10 including a first positive-side output terminal P1 and a first negative-side output terminal N1, and a second differential output circuit 20 including a second positive-side output terminal P2 and a second negative-side output terminal N2. The differential circuit DC can also include a first output line OUT1 connecting the first positive-side output terminal P1 and the second positive-side output terminal P2, and a second output line OUT2 connecting the first negative-side output terminal N1 and the second negative-side output terminal N2. The amplitude modulated signal as the output of the output circuit 100 is output by the first output line OUT1 and the second output line OUT2.

The arrangements of the first differential output circuit 10 and the second differential output circuit 20 of the third embodiment are different from the arrangements of the first differential output circuit 10 and the second differential output circuit 20 of the first embodiment. However, the output circuit 100 of the third embodiment can operate in a similar manner to the output circuit 100 of the first embodiment. The 11th resistive element R11 of the first embodiment is replaced with a 101st resistive element R101 and a 111th resistive element R111, and the 12th resistive element R12 of the first embodiment is replaced with a 102nd resistive element R102 and a 112th resistive element R112. In addition, the 21st resistive element R21 of the first embodiment is replaced with a 201st resistive element R201 and a 211th resistive element R211, and the 22nd resistive element R22 of the first embodiment is replaced with a 202nd resistive element R202 and a 212th resistive element R212.

The 101st resistive element R101 and the 111th resistive element R111 can have a resistance value equal to the resistance value of the 11th resistive element R11. The 102nd resistive element R102 and the 112th resistive element R112 can have a resistance value equal to the resistance value of the 12th resistive element R12. The 201st resistive element R201 and a 211th resistive element R211 can have a resistance value equal to the resistance value of the 21st resistive element R21. The 202nd resistive element R202 and the 212th resistive element R212 can have a resistance value equal to the resistance value of the 22nd resistive element R22.

The first differential output circuit 10 can include an 11th switch element S11 arranged between the first power supply line VS1 and the first positive-side output terminal P1, and a 12th switch element S12 arranged between the first power supply line VS1 and the first negative-side output terminal N1. The first differential output circuit 10 can also include the 101st resistive element R101 arranged between the 11th switch element S11 and the first positive-side output terminal P1, and the 111th resistive element R111 arranged between the 12th switch element S12 and the first negative-side output terminal N1. The first differential output circuit 10 can also include a 13th switch element S13 arranged between the second power supply line VS2 and the first positive-side output terminal P1, and a 14th switch element S14 arranged between the second power supply line VS2 and the first negative-side output terminal N1. The first differential output circuit 10 can also include the 102nd resistive element R102 arranged between the 13th switch element S13 and the first positive-side output terminal P1, and the 112th resistive element R112 arranged between the 14th switch element S14 and the first negative-side output terminal N1.

The second differential output circuit 20 can include a 21st switch element S21 arranged between the first power supply line VS1 and the second positive-side output terminal P2, and a 22nd switch element S22 arranged between the first power supply line VS1 and the second negative-side output terminal N2. The second differential output circuit 20 can also include the 201st resistive element R201 arranged between the 21st switch element S21 and the second positive-side output terminal P2, and the 211th resistive element R211 arranged between the 22nd switch element S22 and the second negative-side output terminal N2. The second differential output circuit 20 can also include a 23rd switch element S23 arranged between the second power supply line VS2 and the second positive-side output terminal P2, and a 24th switch element S24 arranged between the second power supply line VS2 and the second negative-side output terminal N2. The second differential output circuit 20 can also include the 202nd resistive element R202 arranged between the 23rd switch element S23 and the second positive-side output terminal P2, and the 212th resistive element R212 arranged between the 24th switch element S24 and the second negative-side output terminal N2.

In the third embodiment, the resistive elements are arranged between the switch elements and the output lines OUT1 and OUT2. This is advantageous in improving the ESD resistance. As a matter of course, an ESD protection circuit 60 may be provided as in the first embodiment.

Figure 13:
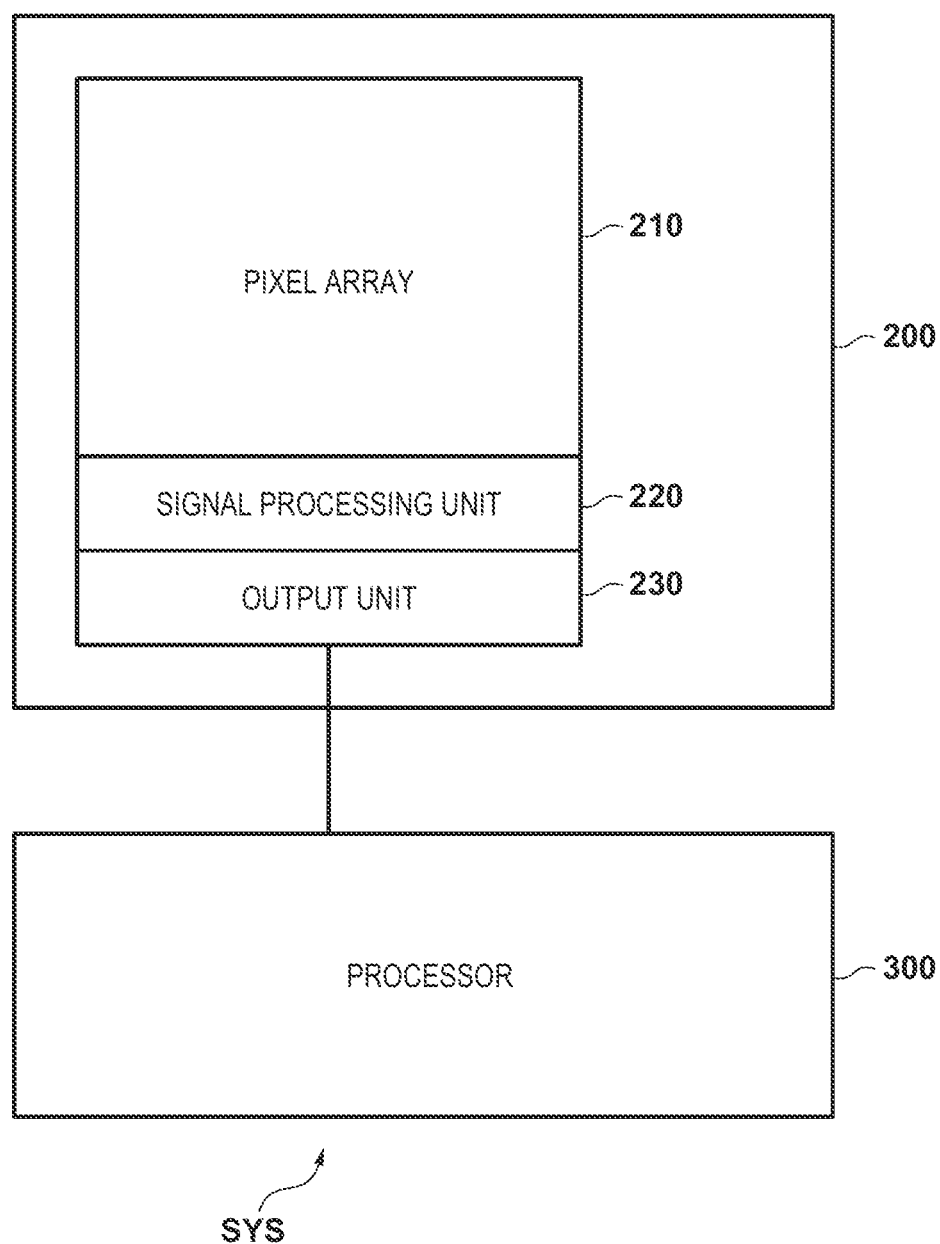
FIG. 13 is a view for explaining a photoelectric conversion device, a photoelectric conversion system, and an electronic apparatus.

FIG. 13 shows a photoelectric conversion system SYS according to an application example of the output circuit 100 represented by the first to third embodiments. The photoelectric conversion system SYS may be understood as an example of an electronic apparatus to which the output circuit 100 is applied. The photoelectric conversion system SYS can include a photoelectric conversion device 200. The photoelectric conversion device 200 can include a pixel array 210 including a plurality of pixels, and a signal processing unit 220 including an AD conversion unit that converts an analog signal output from the pixel array 210 into a digital signal. The photoelectric conversion device 200 can also include an output unit 230 configured to output an amplitude modulated signal having a voltage value selected from three or more voltage values based on the signal output from the signal processing unit 220. The output unit 230 can have an arrangement similar to that of the output circuit 100 represented by the first to third embodiments. The photoelectric conversion system SYS may include a processor 300 (second device) that processes the signal output by the photoelectric conversion device 200. The photoelectric conversion device 200 may be replaced with another device (first device) including the output unit 230.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-015634, filed Feb. 3, 2023, which is hereby incorporated by reference herein in its entirety.

What is claimed is:

1. An output circuit that outputs an amplitude modulated signal having a voltage value selected from three or more voltage values, the circuit comprising:
    a differential circuit arranged between a first power supply line and a second power supply line; and
    a switch and a resistor connected in series so as to form a path connecting the first power supply line and the second power supply line,
    wherein the differential circuit includes
    a first differential output circuit including a first positive-side output terminal and a first negative-side output terminal,
    a second differential output circuit including a second positive-side output terminal and a second negative-side output terminal,
    a first output line configured to connect the first positive-side output terminal and the second positive-side output terminal, and
    a second output line configured to connect the first negative-side output terminal and the second negative-side output terminal,
    the amplitude modulated signal is output by the first output line and the second output line,
    the switch and the resistor suppress a change of a value of a current flowing between the first power supply line and the second power supply line, which is caused by a change of an operation state of the differential circuit, and
    the circuit further comprises a disconnector configured to disconnect the second differential output circuit from the first differential output circuit.

2. The circuit according to claim 1, wherein
    the disconnector includes
    a first switch arranged in the first output line so as to be capable of disconnecting the second differential output circuit from the first differential output circuit, and
    a second switch arranged in the second output line so as to be capable of disconnecting the second differential output circuit from the first differential output circuit.

3. The circuit according to claim 1, further comprising a current path provided in parallel with a load connected between the first output line and the second output line,
    wherein a third switch and a third resistor are arranged in series in the current path.

4. The circuit according to claim 1, wherein
    the operation state of the differential circuit includes
    a first state in which the first differential output circuit and the second differential output circuit drive a load connected between the first output line and the second output line, and
    a second state in which the first differential output circuit alone drives the load.

5. The circuit according to claim 4, wherein
    the switch is set in a conductive state in the second state.

6. The circuit according to claim 5, wherein
    a value of a current flowing between the first power supply line and the second power supply line through the differential circuit in the first state is equal to a value of a current flowing between the first power supply line and the second power supply line through the differential circuit and the path in the second state.

7. The circuit according to claim 1, further comprising a capacitor arranged between the first power supply line and the second power supply line.

8. The circuit according to claim 1, further comprising an ESD protection circuit configured to protect the differential circuit.

9. The circuit according to claim 1, wherein
    the first differential output circuit includes an 11th resistive element arranged between the first power supply line and the first positive-side output terminal, an 11th switch element arranged between the 11th resistive element and the first positive-side output terminal, a 12th switch element arranged between the 11th resistive element and the first negative-side output terminal, a 12th resistive element arranged between the second power supply line and the first negative-side output terminal, a 13th switch element arranged between the 12th resistive element and the first positive-side output terminal, and a 14th switch element arranged between the 12th resistive element and the first negative-side output terminal, and
    the second differential output circuit includes a 21st resistive element arranged between the first power supply line and the second positive-side output terminal, a 21st switch element arranged between the 21st resistive element and the second positive-side output terminal, a 22nd switch element arranged between the 21st resistive element and the second negative-side output terminal, a 22nd resistive element arranged between the second power supply line and the second positive-side output terminal, a 23rd switch element arranged between the 22nd resistive element and the second positive-side output terminal, and a 24th switch element arranged between the 22nd resistive element and the second negative-side output terminal.

10. The circuit according to claim 9, wherein
    the path is arranged so as to connect the 21st resistive element and the 22nd resistive element.

11. The circuit according to claim 9, further comprising:
    a first switch arranged between the 21st resistive element and a node connecting the 21st switch element and the 22nd switch element, and
    a second switch arranged between the 22nd resistive element and a node connecting a 23rd switch element and the 24th switch element.

12. The circuit according to claim 1, wherein
the path is arranged so as to connect the 21st resistive element and the 22nd resistive element.

13. The circuit according to claim 1, wherein
the first differential output circuit includes an 11th switch element arranged between the first power supply line and the first positive-side output terminal, a 12th switch element arranged between the first power supply line and the first negative-side output terminal, a 101st resistive element arranged between the 11th switch element and the first positive-side output terminal, the 111th resistive element arranged between the 12th switch element and the first negative-side output terminal, a 13th switch element arranged between the second power supply line and the first positive-side output terminal, a 14th switch element arranged between the second power supply line and the first negative-side output terminal, a 102nd resistive element arranged between the 13th switch element and the first positive-side output terminal, and a 112th resistive element arranged between the 14th switch element and the first negative-side output terminal, and
the second differential output circuit includes a 21st switch element arranged between the first power supply line and the second positive-side output terminal, a 22nd switch element arranged between the first power supply line and the second negative-side output terminal, a 201st resistive element arranged between the 21st switch element and the second positive-side output terminal, the 211th resistive element arranged between the 22nd switch element and the second negative-side output terminal, a 23rd switch element arranged between the second power supply line and the second positive-side output terminal, a 24th switch element arranged between the second power supply line and the second negative-side output terminal, a 202nd resistive element arranged between the 23rd switch element and the second positive-side output terminal, and a 212th resistive element arranged between the 24th switch element and the second negative-side output terminal.

14. The circuit according to claim 1, further comprising a control circuit configured to control the differential circuit and the switch.

15. A photoelectric conversion device comprising:
a pixel array including a plurality of pixels;
a signal processing unit including an AD conversion unit configured to convert an analog signal output from the pixel array into a digital signal; and
an output circuit defined in claim 1, which is configured to output an amplitude modulated signal having a voltage value selected from three or more voltage values based on a signal output from the signal processing unit.

16. A photoelectric conversion system comprising:
a photoelectric conversion device defined in claim 1; and
a processor configured to process a signal output by the photoelectric conversion device.

17. An electronic apparatus comprising an output circuit defined in claim 1.

* * * * *